(12) United States Patent
Jefferson

(10) Patent No.: US 7,463,544 B1
(45) Date of Patent: Dec. 9, 2008

(54) DEVICE PROGRAMMABLE TO OPERATE AS A MULTIPLEXER, DEMULTIPLEXER, OR MEMORY DEVICE

(75) Inventor: David Jefferson, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 1075 days.

(21) Appl. No.: 10/452,992

(22) Filed: Jun. 2, 2003

Related U.S. Application Data

(63) Continuation-in-part of application No. 10/272,564, filed on Oct. 15, 2002, now abandoned.

(60) Provisional application No. 60/329,674, filed on Oct. 15, 2001.

(51) Int. Cl.
*G11C 8/00* (2006.01)

(52) U.S. Cl. ............... 365/230.02; 365/230.05; 365/230.06

(58) Field of Classification Search ............ 365/230.02, 365/230.05, 230.06
See application file for complete search history.

(56) References Cited

U.S. PATENT DOCUMENTS

| | | | |
|---|---|---|---|
| 5,475,649 A * | 12/1995 | Balistreri et al. ....... | 365/230.02 |
| 5,550,782 A | 8/1996 | Cliff et al. | |
| 5,867,422 A * | 2/1999 | John ........................ | 365/168 |
| 5,977,791 A | 11/1999 | Veenstra | |
| 6,052,327 A * | 4/2000 | Reddy et al. ........... | 365/230.05 |
| 6,084,427 A | 7/2000 | Lee et al. | |
| 6,141,721 A * | 10/2000 | Patterson et al. ............... | 711/1 |
| 6,216,205 B1 * | 4/2001 | Chin et al. ................... | 711/131 |
| 6,282,150 B1 * | 8/2001 | Edo ...................... | 365/233.13 |
| 6,486,702 B1 | 11/2002 | Ngai et al. | |
| 6,515,920 B2 * | 2/2003 | Nakano et al. ......... | 365/189.14 |
| 2002/0110027 A1 * | 8/2002 | Nakano et al. .............. | 365/200 |

OTHER PUBLICATIONS

Altera, Apex II, Programmable Logic Device Family, Data Sheet, ver. 1.1, May 2001, pp. 1-4, 28-38, 60-62.
Altera, Using General-Purpose PLLs with Apex II Device, Application Note 156, ver. 1.2, Aug. 2001, pp. 1-8.

* cited by examiner

*Primary Examiner*—Tuan T. Nguyen
(74) *Attorney, Agent, or Firm*—Townsend and Townsend and Crew LLP

(57) ABSTRACT

A device that is programmable to operate as a memory device, a multiplexer, or a demultiplexer includes: a first column decoder; a memory array coupled to the first column decoder; a plurality of selectors coupled to the memory array; and a second column decoder coupled to the plurality of selectors.

46 Claims, 8 Drawing Sheets

DEVICE PROGRAMMABLE TO OPERATE AS A MULTIPLEXER, DEMULTIPLEXER, OR MEMORY DEVICE

CROSS-REFERENCE TO RELATED APPLICATIONS

This application is a continuation-in-part of U.S. application Ser. No. 10/272,564, filed Oct. 15, 2002, entitled "A Device Programmable To Operate As A Multiplexer, Demultiplexer, Or Memory Device," which claims the benefits of U.S. Provisional Application Ser. No. 60/329,674, filed Oct. 15, 2001, and entitled "EAB Operating As A Mux/Demux," both of which are incorporated herein by reference.

BACKGROUND OF THE INVENTION

It is sometimes desirable to implement a multiplexer using a general purpose device that can be used to implement other devices in addition to a multiplexer. For example, Logic Array Blocks (LABs) have been used to implement a multiplexer.

Using LABs to implement a multiplexer suffers from some disadvantages. First, implementing a multiplexer using LABs consumes a relatively large chip area. For example, implementing a 32X1 multiplexer requires 3 to 4 LABs. Second, a multiplexer implemented using LABs is relatively slow. Implementation of a multiplexer using LABs involves passing through numerous logic levels before generating an output, thus slowing down the process.

The present invention addresses these and other disadvantages of existing implementations of multiplexers.

SUMMARY OF THE INVENTION

The present invention encompasses a device that is programmable to operate as a memory device; a multiplexer, or a demultiplexer. The device includes: a first column decoder; a memory array coupled to the first column decoder; a plurality of selectors coupled to the memory array; and a second column decoder coupled to the plurality of selectors.

The present invention is explained in more detail below with reference to the drawings.

DETAILED DESCRIPTION OF THE INVENTION

The present invention comprises a device that is programmable to operate as a memory device, a multiplexer or demultiplexer. The following description is presented to enable any person skilled in the art to make and use the invention, and is provided in the context of a particular application and its requirements. Various modifications to the embodiments shown will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
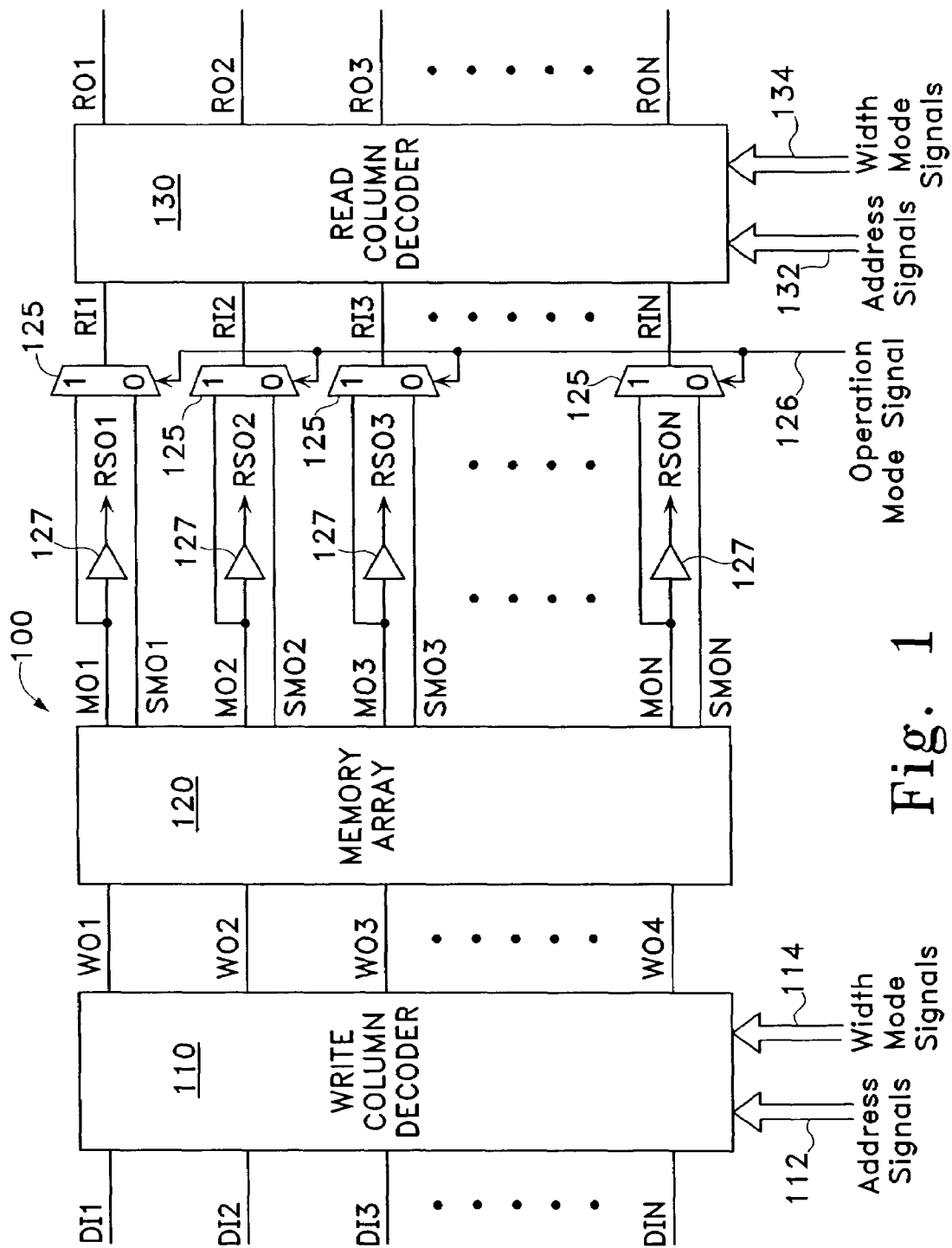
FIG. 1 is a block diagram of one embodiment of the device of the present invention.

FIG. 1 is a block diagram of one embodiment of the device of the present invention. In FIG. 1, device 100 (which is programmable to operate as a memory device, a multiplexer, or a demultiplexer) includes a write column decoder 110, a memory array 120, N 2X1 multiplexers 125 (which may also herein be referred to as selectors), and a read column decoder 130. In one embodiment, N is an integer equal to $2^n$, where n is an integer greater than or equal to 1. N may, for example, be equal to 8, 16, or 32. In another embodiment, N is equal to $(8 \times 2^m + 4)$, where m is an integer greater than or equal to 0.

Write column decoder 110 includes a plurality of write column decoder data input terminals DI1 to DIN and a plurality of write column decoder data output terminals WO1 to WON. Write column decoder 110 receives input data signals on the terminals DI1 to DIN. Moreover, write column decoder 110 provides output data signals on the terminals WO1 to WON. The write column decoder 110 also includes address input terminals 112 and width mode input terminals 114, on which it receives address signals and width mode signals, respectively.

Write column decoder 110 is coupled to memory array 120 by the terminals WO1 to WON. The memory array 120 includes memory array output terminals MO1 to MON, on which it outputs data signals received from the write column decoder 110 on terminals WO1 to WON, respectively, and not stored in memory array 120. Memory array 120 outputs data signals stored in the memory array 120 on memory array output terminals SMO1 to SMON. Data signals output by memory array 120 on terminals SMO1 to SMON were originally received from the write column decoder 110 on terminals WO1 to WON, respectively. Each terminal of terminals MO1 to MON is coupled to an input terminal of a corresponding 2X1 selector 125. Each terminal of terminals SMO1 to SMON is coupled to the other input terminal of a corresponding 2X1 selector 125. In one embodiment, the memory array 120 is a static random access memory (SRAM) array. In one embodiment, the memory array 120 is a dual output port memory array.

Each selector of selectors 125 receives an operation mode signal on the operation mode input terminal 126. The operation mode signal acts as a selection signal for selectors 125. In one embodiment, the operation mode signal is stored in a configuration random access memory (CRAM). When device 100 operates as either a multiplexer or demultiplexer, then the selection signal prompts selecting the data signal received on input terminals of the selectors 125 coupled to the MO1 to MON terminals. In one embodiment, when the device 100 operates as either a multiplexer or demultiplexer, then the row drivers (not shown) of device 100 are disabled. When device 100 operates as a memory device, then the selection signal prompts selecting the data signal received on input terminals of the selectors 125 coupled to the SMO1 to SMON terminals.

The selectors 125 are coupled to the read column decoder 130. The read column decoder 130 includes read column data input terminals RI1 to RIN, the read column data output terminals RO1 to RON, address input terminals 132 and width mode input terminals 134. The read column decoder 130 receives the data selected by selectors 125 on the terminals RI1 to RIN. It is to be noted that RI1 to RIN receive data signals from terminals SMO1 to SMON, respectively, or terminals MO1 to MON, respectively. The read column decoder 130 also receives address signals and width mode signals on the address input terminals 132 and the width mode input terminals 134, respectively. The read column decoder outputs data signals on the terminals RO1 to RON. Terminals RO1 to RON are a first set of output terminals of device 100.

As shown in FIG. 1, terminals MO1 to MON are coupled to N sense amplifiers 127. The N sense amplifiers 127 receive signals on terminals MO1 to MON, amplify the signals, and output them on terminals RSO1 to RSON. Each sense amplifier 127 of the N sense amplifiers 127 is coupled to a corresponding terminal of terminals MO1 to MON and to a corresponding terminal of terminals RSO1 to RSON. Terminals RSO1 to RSON are a second set of output terminals of device 100.

Figure 2:
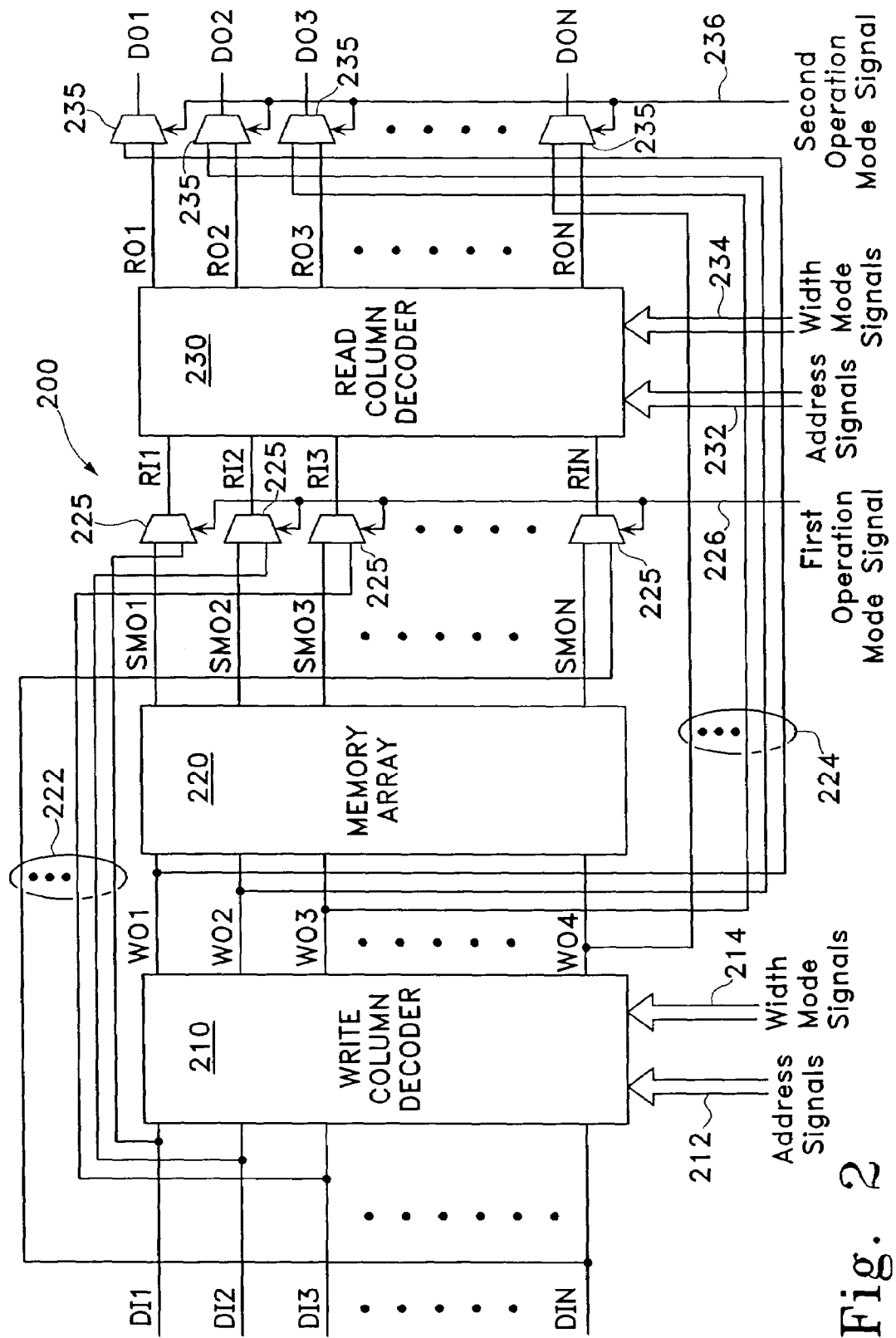
FIG. 2 is a block diagram of a second embodiment of the device of the present invention.

FIG. 2 is a block diagram of a second embodiment of the device of the present invention. In FIG. 2, device 200 (which is programmable to operate as a memory device, a multiplexer, or a demultiplexer) includes a write column decoder 210, a memory array 220, a first set of N 2X1 selectors 225, a read column decoder 230, a second set of N 2X1 selectors 235.

Write column decoder 210 includes a plurality of write column decoder data input terminals DI1 to DIN and a plurality of write column decoder data output terminals WO1 to WON. Write column decoder 210 receives input data signals on the terminals DI1 to DIN. The write column decoder 210 also includes address input terminals 212 and width mode input terminals 214, on which it receives address signals and width mode signals, respectively. The write column decoder 210 provides output data signals on the terminals WO1 to WON.

Write column decoder 210 is coupled to the memory array 220 by the terminals WO1 to WON. The memory array 220 includes memory array output terminals SMO1 to SMON, on which it outputs data signals stored in the memory array 220. Data signals output by memory array 120 on terminals SMO1 to SMON were originally received from the write column decoder 110 on terminals WO1 to WON, respectively. Each terminal of terminals SMO1 to SMON is coupled to an input terminal of a corresponding 2X1 selector 225. For each selector of selectors 225, the other input terminal is coupled to a corresponding line of lines 222. As can be seen in FIG. 2, lines 222 are coupled to the terminals DI1 to DIN and selectors 225. Each line of lines 222 is coupled to a corresponding terminal of terminals DI1 to DIN. Additionally, each line of lines 222 is coupled to an input terminal of a corresponding selector of selectors 225. In one embodiment, the memory array 220 is an SRAM array.

Each selector of selectors 225 receives a first operation mode signal on the first operation mode input terminal 226. The first operation mode signal acts as a selection signal for selectors 225. In one embodiment, the first operation mode signal is stored in a CRAM. When device 200 operates as a multiplexer, then the first operation mode signal prompts selecting the data signals received on input terminals of the selectors 225 coupled to lines 222. In other words, data signals input to the terminals DI1 to DIN and sent over lines 222 are selected by selectors 225 when the device 200 operates as a multiplexer. In one embodiment, when the device 200 operates as a multiplexer, then the row drivers (not shown) of device 200 are disabled. When device 200 operates as a memory device, then the first operation mode signal prompts selecting the data signals received on input terminals of the selectors 225 coupled to the SMO1 to SMON terminals. In other words, data signals stored in memory array 220 or received by memory array via write column decoder data output terminals WO1 to WON are selected by selectors 225 when the device 200 operates as a memory device.

In one embodiment, when device 200 operates as a demultiplexer, then the first operation mode signal prompts selecting the data signals received on input terminals of the selectors 225 coupled to lines 222. In another embodiment, when device 200 operates as a demultiplexer, then the first operation mode signal prompts selecting the data signals received on input terminals of the selectors 225 coupled to the SMO1 to SMON terminals.

The selectors 225 are coupled to the read column decoder 230. The read column decoder 230 includes read column data input terminals RI1 to RIN, the read column data output terminals RO1 to RON, address input terminals 232 and width mode input terminals 234. The read column decoder 230 receives the data selected by selectors 225 on the terminals RI1 to RIN. The read column decoder 230 also receives address signals and width mode signals on the address input terminals 232 and the width mode input terminals 234, respectively. The read column decoder outputs data signals on the terminals RO1 to RON.

The read column decoder 230 is coupled to N 2X1 selectors 235 by the read column data output terminals RO1 to RON. Each terminal of terminals RO1 to RON is coupled to an input terminal of a corresponding selector of selectors 235. For each selector of selectors 235, the other input terminal is coupled to a corresponding line of lines 224. As can be seen in FIG. 2, lines 224 are coupled to the terminals WO1 to WON and selectors 235. Each line of lines 224 is coupled to a corresponding terminal of terminals WO1 to WON. Additionally, each line of lines 224 is coupled to an input terminal of a corresponding selector of selectors 235.

Each selector of selectors 235 receives a second operation mode signal on the second operation mode input terminal 236. The second operation mode signal acts as a selection signal for selectors 235. In one embodiment, the second operation mode signal is stored in a CRAM. When device 200 operates as a demultiplexer, then the second operation mode signal prompts selecting the data signals received on input terminals of the selectors 235 coupled to lines 224. In other words, data signals output by the write column decoder 210 onto write decoder data output terminals WO1 to WON and sent over lines 224 are selected by selectors 235 when the device 200 operates as a demultiplexer. In one embodiment, when the device 200 operates as a demultiplexer, then the row drivers (not shown) of device 200 are disabled. When device 200 operates as a memory device or a multiplexer, then the second mode operation signal prompts selecting the data signals received on input terminals of the selectors 235 coupled to the RO1 to RON terminals. In other words, when device 200 operates as a multiplexer or memory device, data signals provided by the read column decoder 230 are selected by the selectors 235.

Figure 3:
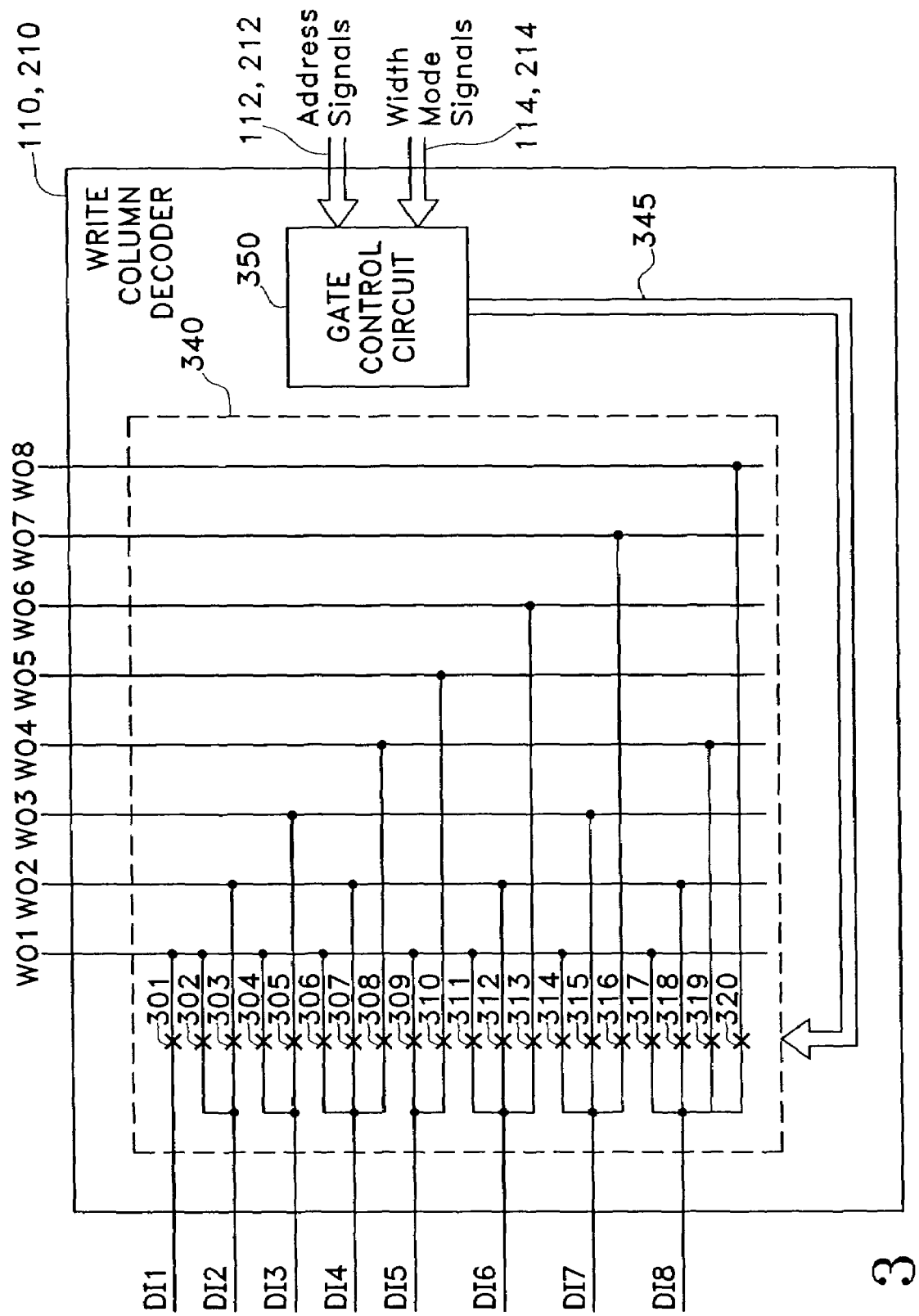
FIG. 3 is a detailed diagram of one embodiment of the write column decoder used in the present invention.

FIG. 3 is a detailed diagram of one embodiment of the write column decoder 110, 210 used in the present invention. In FIG. 3, the write column decoder 110, 210 includes eight write column decoder data input terminals DI1 to DI8 and eight write column decoder data output terminals WO1 to WO8. In other words, the integer N in FIGS. 1 and 2, and described above, is equal to 8. It is to be noted that the write column decoder 110, 210 is not limited to the 8 input, 8 output embodiment. Instead, it can have any number of N inputs and outputs as defined above.

In FIG. 3, write column decoder 110, 210 includes signal routing circuit 340, gate control circuit 350, write column data input terminals DI1 to DI8, and write column data output terminals WO1 to WO8. The gate control circuit 350 may also herein be referred to as a write column decoder control circuit 350. Input data signals are received by the signal routing circuit 340 via the write column data input terminals DI1 to DI8. Data signals are output by the signal routing circuit 340 via the write column data output terminals WO1 to WO8. Address signals are received on address data terminals 112, 212 coupled to the gate control circuit 350. Similarly, width mode signals are received on the width mode terminals 114, 214 coupled to the gate control circuit 350.

The signal routing circuit 340 includes gates 301-320. In one embodiment, gates 301-320 comprise switches. The switches may comprise transistors. The transistors may, for example, be n-channel metal oxide semiconductor (NMOS) transistors or p-channel metal oxide semiconductor (PMOS) transistors.

Signal routing circuit 340 is coupled to the gate control circuit 350 via lines 345. More specifically, gates 301-320 are coupled to gate control circuit 350. The control signals output by the gate control circuit 350 are determined by the state of the address signals and width mode signals received on the address terminals 112, 212 and width mode terminals 114, 214, respectively. Control signals from gate control circuit 350 control the state of gates 301-320. When a control signal causes a gate to be on, then the write column decoder data input and output terminals between which the gate is disposed are electrically coupled. Otherwise, they are electrically isolated. For example, when gate 302 is on, then write column decoder data input terminal DI2 is electrically coupled to write column decoder data output terminal WO1. In such a case, a data input signal received on terminal DI2 is passed on to terminal WO1.

Figure 4:
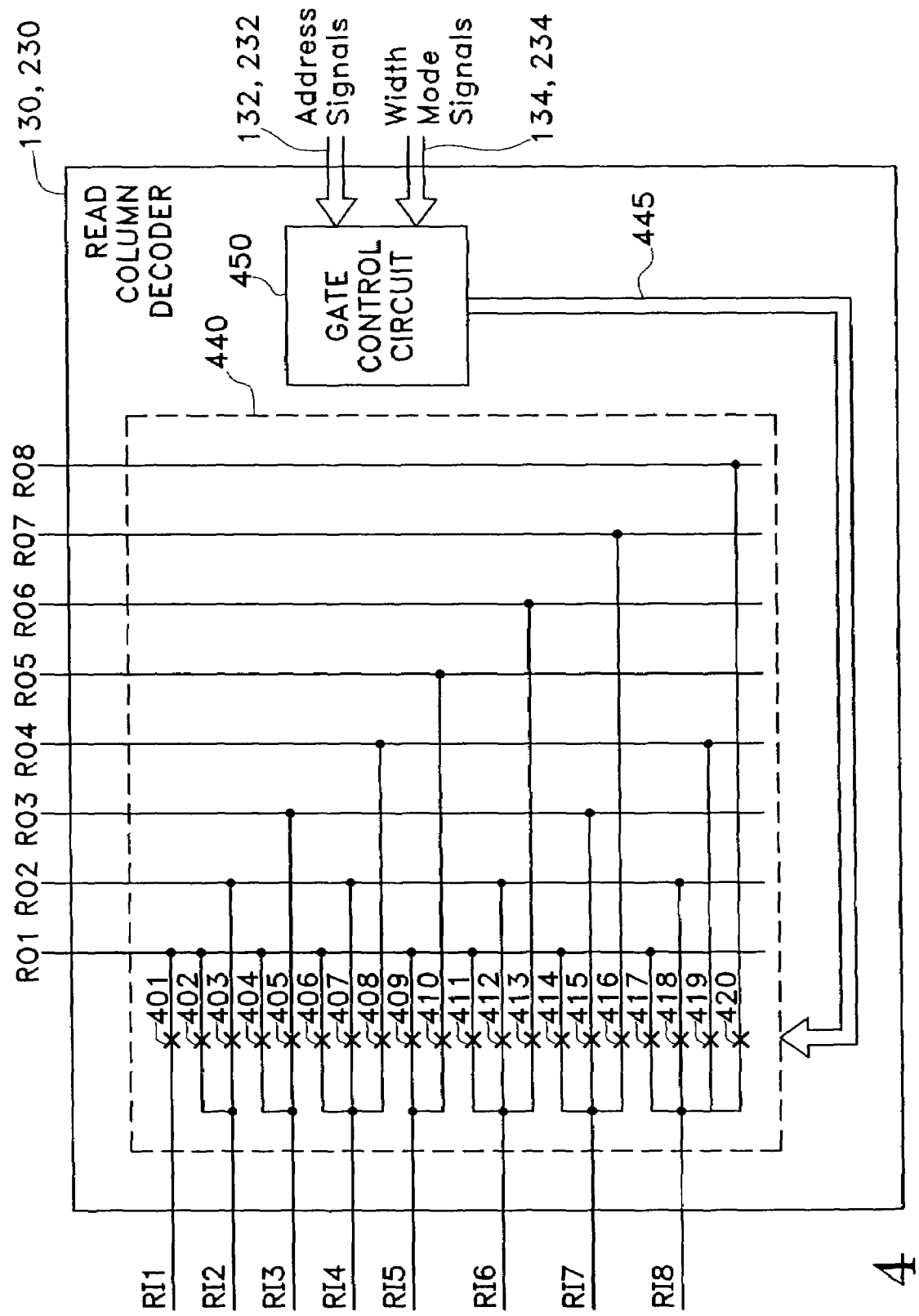
FIG. 4 is a detailed diagram of one embodiment of the read column decoder used in the present invention.

FIG. 4 is a detailed diagram of one embodiment of the read column decoder 130, 230 used in the present invention. In FIG. 4, the read column decoder 130, 230 includes eight read column decoder data input terminals RI1 to RI8 and eight read column decoder data output terminals RO1 to RO8. In other words, the integer N in FIGS. 1 and 2, and described above, is equal to 8. It is to be noted that the read column decoder 130, 230 is not limited to the 8 input, 8 output embodiment. Instead, it can have any number of N inputs and outputs as defined above.

In FIG. 4, read column decoder 130, 230 includes signal routing circuit 440, gate control circuit 450, read column data input terminals RI1 to RI8, and read column data output terminals RO1 to RO8. The gate control circuit 450 may also herein be referred to as a read column decoder control circuit 450. Input data signals are received by the signal routing circuit 440 via the read column data input terminals RI1 to RI8. Data signals are output by the signal routing circuit 440 via the read column data output terminals RO1 to RO8. Address signals are received on address data terminals 132, 232 coupled to the gate control circuit 450. Similarly, width mode signals are received on the width mode terminals 134, 234 coupled to the gate control circuit 450.

The signal routing circuit 440 includes gates 401-420. In one embodiment, gates 401-420 comprise switches. The switches may comprise transistors. The transistors may, for example, be NMOS transistors or PMOS transistors.

Signal routing circuit 440 is coupled to the gate control circuit 450 via lines 445. More specifically, gates 401-420 are coupled to gate control circuit 450. Control signals from gate control circuit 450 control the state of gates 401-420. The control signals output by the gate control circuit 450 are determined by the state of the address signals and width mode signals received on the address terminals 132, 232 and width mode terminals 134, 234, respectively. When a control signal causes a gate to be on, then the read column decoder data input and output terminals between which the gate is disposed are electrically coupled. Otherwise, they are electrically isolated. For example, when gate 419 is on, then read column decoder data input terminal RI8 is electrically coupled to read column decoder data output terminal RO4. In such a case, a data input signal received on terminal RI8 is passed on to terminal RO4.

Figure 5:
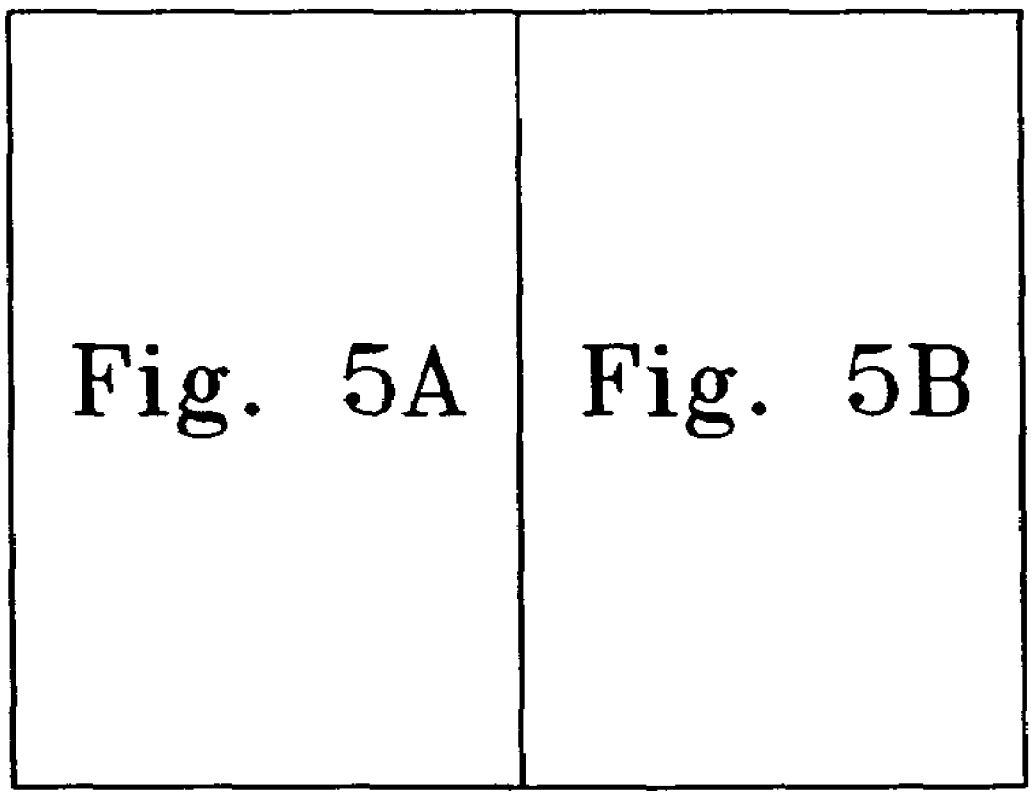
FIG. 5 is a detailed diagram of one embodiment of the gate control circuit shown in FIGS. 3, 4, and 6.
Figure 5A:
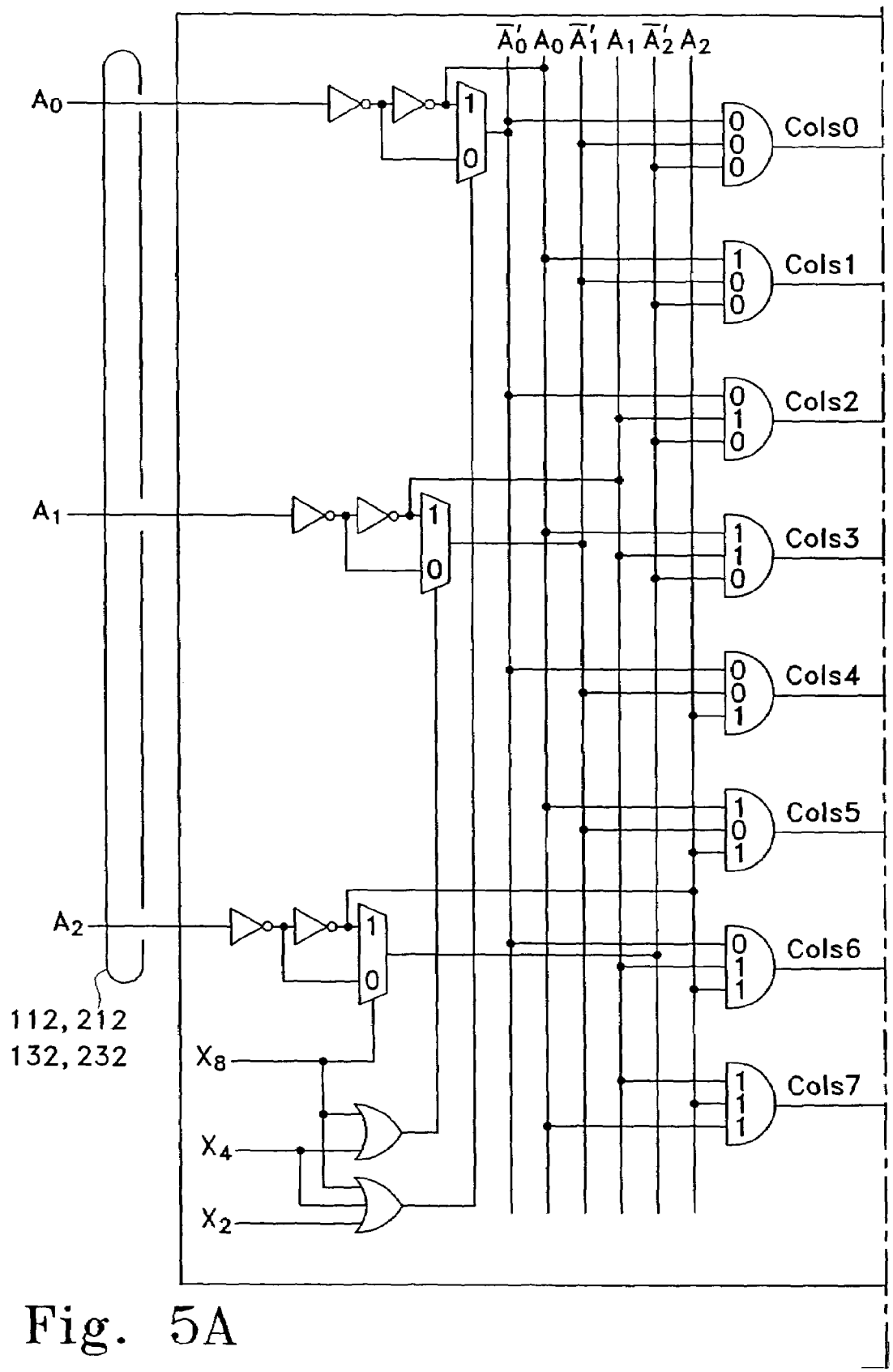
Figure 5B:
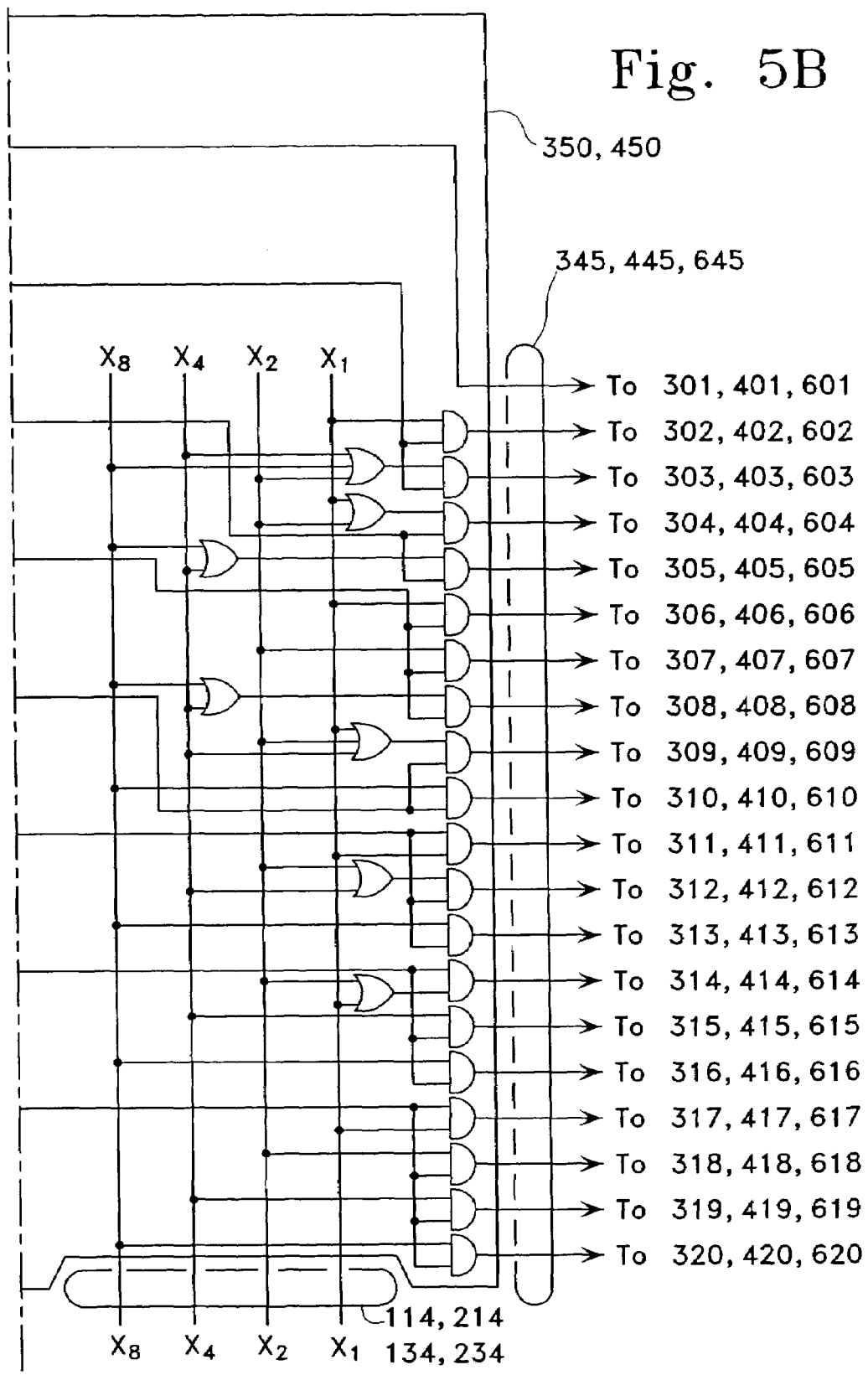
Figure 6:
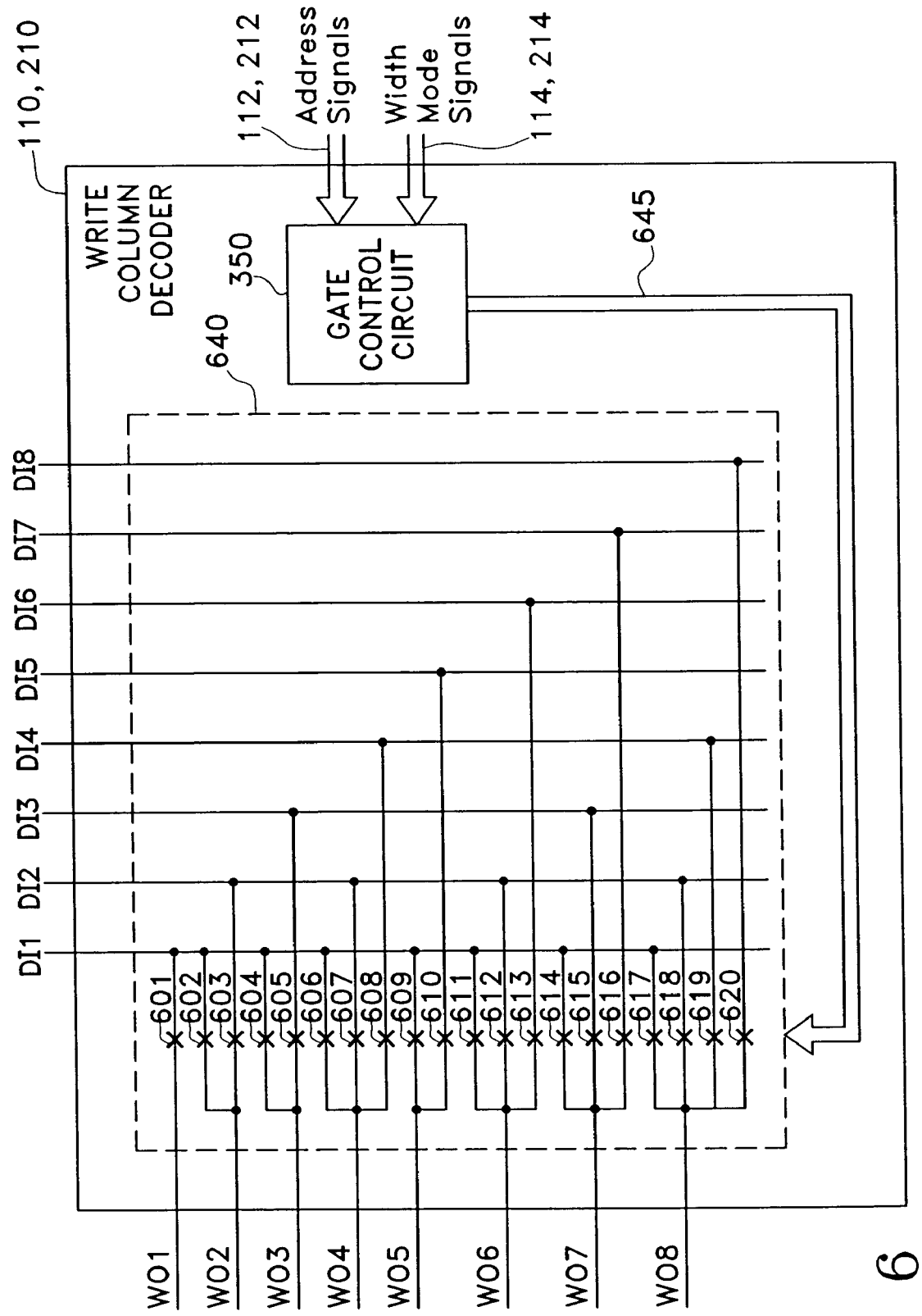
FIG. 6 is a detailed diagram of another embodiment of the write column decoder used in the present invention.

FIG. 5 is a detailed diagram of one embodiment of the gate control circuit 350 of FIGS. 3 and 6 and gate control circuit 450 of FIG. 4. In FIG. 5, gate control circuit 350/450 receives address signals $A_0$, $A_1$, and $A_2$ on address signal terminals 112 (or 212)/132 (or 232). Similarly, gate control circuit 350/450 receives width mode signals $X_1$, $X_2$, $X_4$, and $X_8$ on width mode terminals 114 (or 214)/134 (or 234). In response to these signals, the gate control circuit 350/450 outputs on lines 345 (or 645/445 gate control signals to gates 301-320 (or 601-620)/401-420.

Table 1 below shows the relationship between the width mode signals, the address signals, and the gates in the signal routing circuit 340 which are turned on.

TABLE 1

| Width Mode Signal | | | | A[2:0] | | | Gates in the signal routing circuit |
|---|---|---|---|---|---|---|---|
| $X_1$ | $X_2$ | $X_4$ | $X_8$ | $A_2$ | $A_1$ | $A_0$ | 340 which are turned on |
| 1 | 0 | 0 | 0 | 0 | 0 | 0 | 301 |
| | | | | 0 | 0 | 1 | 302 |
| | | | | 0 | 1 | 0 | 304 |
| | | | | 0 | 1 | 1 | 306 |
| | | | | 1 | 0 | 0 | 309 |
| | | | | 1 | 0 | 1 | 311 |
| | | | | 1 | 1 | 0 | 314 |
| | | | | 1 | 1 | 1 | 317 |
| 0 | 1 | 0 | 0 | 0 | 0 | x | 301, 303 |
| | | | | 0 | 1 | x | 304, 307 |
| | | | | 1 | 0 | x | 309, 312 |
| | | | | 1 | 1 | x | 314, 318 |
| 0 | 0 | 1 | 0 | 0 | x | x | 301, 303, 305, 308 |
| | | | | 1 | x | x | 309, 312, 315, 319 |
| 0 | 0 | 0 | 1 | x | x | x | 301, 303, 305, 308, 310, 313, 316, 320 |

As can be seen in Table 1, when the width of the write column decoder is set at one wide, i.e., $X_1$ is asserted (i.e., is set at 1) while $X_2$, $X_4$, and $X_8$ are de-asserted (i.e., are set at 0), then only one gate is on for each address signal. For example, when the address signal is 010 (i.e., $A_0$=0, $A_1$=1, and $A_2$=0), then only gate 304 is on and the remaining gates are off.

As can be seen in Table 1, when the width of the write column decoder is set at one wide, then for each address input, one of gates 301, 302, 304, 306, 309, 311, 314, and 317 is on, while the other gates are off. As can be seen in FIG. 3, gates 301, 302, 304, 306, 309, 311, 314, and 317 are coupled to terminals DI1, DI2, DI3, DI4, DI5, DI6, DI7, and DI8, respectively. Moreover, gates 301, 302, 304, 306, 309, 311, 314, and 317 are all coupled to only output terminal WO1. Thus, when the width of the write column decoder 110, 210 is set at one wide, then data signals received on only one of the write column decoder data input terminals DI1 to DI8 is output by the write column decoder 110, 210 on the write column decoder data output terminal WO1.

When the width of the write column decoder is set at two wide, i.e., $X_2$ is asserted (i.e., is set at 1) while $X_1$, $X_4$, and $X_8$ are de-asserted (i.e., are set at 0), then only two gates are on for each address input. For example, when the address signal is 01x (i.e., $A_0$=x, $A_1$=1, and $A_2$=0, where x is either 0 or 1), then only gates 304 and 307 are on and the remaining gates are off.

As can be seen in Table 1, when the width of the write column decoder is set at two wide, then for each address input, two of gates 301, 303, 304, 307, 309, 312, 314, and 318 are on, while the other gates are off. More specifically, gates 301 and 303, gates 304 and 307, gates 309 and 311, or gates 314 and 318 are on, while the other gates are off. As can be seen in FIG. 3, gates 301 and 303, gates 304 and 307, gates 309 and 311, and gates 314 and 318 are coupled to terminals DI1 and DI2, terminals DI3 and DI4, terminals DI5 and DI6, and terminals DI7 and DI8, respectively. As can also be seen in FIG. 3, gates 301 and 303, gates 304 and 307, gates 309 and 311, and gates 314 and 318 are coupled to terminals WO1 and WO2 only. Thus, when the width of the write column decoder 110, 210 is set at two wide, then data signals received on only two of the write column decoder data input terminals DI1 to DI8 are output by the write column decoder 110, 210 on the write column decoder data output terminals WO1 and WO2. More specifically, data signals received on input terminals DI1 and DI2, terminals DI3 and DI4, terminals DI5 and DI6, or terminals DI7 and DI8, are coupled to output terminals WO1 and WO2.

When the width of the write column decoder is set at four wide, i.e., $X_4$ is asserted (i.e., is set at 1) while $X_1$, $X_2$, and $X_8$ are de-asserted (i.e., are set at 0), then only four gates are on for each address input. For example, when the address signal is 0xx (i.e., $A_0$=x, $A_1$=x, and $A_2$=0, where x is either 0 or 1), then only gates 301, 303, 305, and 308 are on and the remaining gates are off.

As can be seen in Table 1, when the width of the write column decoder is set at four wide, then for each address input, four of gates 301, 303, 305, 308, 309, 312, 315, and 319 are on, while the other gates are off. More specifically, gates 301, 303, 305 and 308, or gates 309, 312, 315 and 319 are on, while the other gates are off. As can be seen in FIG. 3, gates 301, 303, 305 and 308, and gates 309, 312, 315 and 319 are coupled to terminals DI1, DI2, DI3 and DI4, and terminals DI5, DI6, DI7 and DI8, respectively. As can also be seen in FIG. 3, gates 301, 303, 305 and 308, and gates 309, 312, 315 and 319 are coupled to terminals WO1, WO2, WO3, and WO4 only. Thus, when the width of the write column decoder 110, 210 is set at four wide, then data signals received on only four of the write column decoder data input terminals DI1 to DI8 are output by the write column decoder 110, 210 on the write column decoder data output terminals WO1, WO2, WO3, and WO4. More specifically, data signals received on input terminals DI1, DI2, DI3 and DI4, or terminals DI5, DI6, DI7 and DI8, are coupled to output terminals WO1, WO2, WO3, and WO4.

When the width of the write column decoder is set at eight wide, i.e., $X_8$ is asserted (i.e., is set at 1) while $X_1$, $X_2$, and $X_4$ are de-asserted (i.e., are set at 0), then only eight gates are on for each address input. For example, when the address signal is xxx (i.e., $A_0$=x, $A_1$=x, and $A_2$=x, where x is either 0 or 1), then only gates 301, 303, 305, 308, 310, 313, 316, and 320 are on and the remaining gates are off.

As can be seen in Table 1, when the width of the write column decoder is set at eight wide, then for each address input, gates 301, 303, 305, 308, 310, 313, 316, and 320 are on, while the other gates are off. As can be seen in FIG. 3, gates 301, 303, 305, 308, 310, 313, 316, and 320 are coupled to terminals DI1, DI2, DI3, DI4, DI5, DI6, DI7 and DI8, respectively. As can also be seen in FIG. 3, gates 301, 303, 305, 308, 310, 313, 316, and 320 are coupled to terminals WO1, WO2, WO3, WO4, WO5, WO6, WO7, and WO8, respectively. Thus, when the width of the write column decoder 110, 210 is set at eight wide, then data signals received on the eight write column decoder data input terminals DI1, DI2, DI3, DI4, DI5, DI6, DI7, and DI8 are output by the write column decoder 110, 210 on the write column decoder data output terminals WO1, WO2, WO3, WO4, WO5, WO6, WO7, and WO8, respectively.

Table 2 below shows the relationship between the width mode signals, the address signals, and the gates in the signal routing circuit 440 which are turned on.

TABLE 2

| Width Mode Signal | | | | A[2:0] | | | Gates in the signal routing circuit |
|---|---|---|---|---|---|---|---|
| $X_1$ | $X_2$ | $X_4$ | $X_8$ | $A_2$ | $A_1$ | $A_0$ | 440 which are turned on |
| 1 | 0 | 0 | 0 | 0 | 0 | 0 | 401 |
| | | | | 0 | 0 | 1 | 402 |
| | | | | 0 | 1 | 0 | 404 |
| | | | | 0 | 1 | 1 | 406 |
| | | | | 1 | 0 | 0 | 409 |
| | | | | 1 | 0 | 1 | 411 |
| | | | | 1 | 1 | 0 | 414 |
| | | | | 1 | 1 | 1 | 417 |
| 0 | 1 | 0 | 0 | 0 | 0 | x | 401, 403 |
| | | | | 0 | 1 | x | 404, 407 |
| | | | | 1 | 0 | x | 409, 412 |
| | | | | 1 | 1 | x | 414, 418 |
| 0 | 0 | 1 | 0 | 0 | x | x | 401, 403, 405, 408 |
| | | | | 1 | x | x | 409, 412, 415, 419 |
| 0 | 0 | 0 | 1 | x | x | x | 401, 403, 405, 408, 410, 413, 416, 420 |

As can be seen in Table 2, when the width of the read column decoder is set at one wide, i.e., $X_1$ is asserted (i.e., is set at 1) while $X_2$, $X_4$, and $X_8$ are de-asserted (i.e., are set at 0), then only one gate is on for each address input. For example, when the address signal is 010 (i.e., $A_0$=0, $A_1$=1, and $A_2$=0), then only gate 404 is on and the remaining gates are off.

As can be seen in Table 2, when the width of the read column decoder is set at one wide, then for each address input, one of gates 401, 402, 404, 406, 409, 411, 414, and 417 is on, while the other gates are off. As can be seen in FIG. 4, gates 401, 402, 404, 406, 409, 411, 414, and 417 are coupled to terminals RI1, RI2, RI3, RI4, RI5, RI6, RI7, and RI8, respectively. Moreover, gates 401, 402, 404, 406, 409, 411, 414, and 417 are all coupled to only output terminal RO1. Thus, when the width of the read column decoder 130, 230 is set at one wide, then data signals received on only one of the read column decoder data input terminals RI1 to RI8 is output by the read column decoder 130, 230 on the read column decoder data output terminal RO1.

When the width of the read column decoder is set at two wide, i.e., $X_2$ is asserted (i.e., is set at 1) while $X_1$, $X_4$, and $X_8$ are de-asserted (i.e., are set at 0), then only two gates are on for each address input. For example, when the address signal is 01x (i.e., $A_0$=x, $A_1$=1, and $A_2$=0, where x is either 0 or 1), then only gates 404 and 407 are on and the remaining gates are off.

As can be seen in Table 2, when the width of the read column decoder is set at two wide, then for each address input, two of gates 401, 403, 404, 407, 409, 412, 414, and 418 are on, while the other gates are off. More specifically, gates 401 and 403, gates 404 and 407, gates 409 and 411, or gates 414 and 418 are on, while the other gates are off. As can be seen in FIG. 4, gates 401 and 403, gates 404 and 407, gates 409 and 411, and gates 414 and 418 are coupled to terminals RI1 and RI2, terminals RI3 and RI4, terminals RI5 and RI6, and terminals RI7 and RI8, respectively. As can also be seen in FIG. 4, gates 401 and 403, gates 404 and 407, gates 409 and 411, and gates 414 and 418 are coupled to terminals RO1 and RO2 only. Thus, when the width of the read column decoder 130, 230 is set at two wide, then data signals received on only two of the read column decoder data input terminals RI1 to RI8 are output by the read column decoder 130, 230 on the read column decoder data output terminals RO1 and RO2. More specifically, data signals received on input terminals RI1 and RI2, terminals RI3 and RI4, terminals RI5 and RI6, or terminals RI7 and RI8, are coupled to output terminals RO1 and RO2.

When the width of the read column decoder is set at four wide, i.e., $X_4$ is asserted (i.e., is set at 1) while $X_1$, $X_2$, and $X_8$ are de-asserted (i.e., are set at 0), then only four gates are on for each address input. For example, when the address signal is 0xx (i.e., $A_0$=x, $A_1$=x, and $A_2$=0, where x is either 0 or 1), then only gates 401, 403, 405, and 408 are on and the remaining gates are off.

As can be seen in Table 2, when the width of the read column decoder is set at four wide, then for each address input, four of gates 401, 403, 405, 408, 409, 412, 415, and 419 are on, while the other gates are off. More specifically, gates 401, 403, 405 and 408, or gates 409, 412, 415 and 419 are on, while the other gates are off. As can be seen in FIG. 4, gates 401, 403, 405 and 408, and gates 409, 412, 415 and 419 are coupled to terminals RI1, RI2, RI3 and RI4, and terminals RI5, RI6, RI7 and RI8, respectively. As can also be seen in FIG. 4, gates 401, 403, 405 and 408, and gates 409, 412, 415 and 419 are coupled to terminals RO1, RO2, RO3, and RO4 only. Thus, when the width of the read column decoder 130, 230 is set at four wide, then data signals received on only four of the read column decoder data input terminals RI1 to RI8 are output by the read column decoder 130, 230 on the read column decoder data output terminals RO1, RO2, RO3, and RO4. More specifically, data signals received on input terminals RI1, RI2, RI3 and RI4, or terminals RI5, RI6, RI7 and RI8, are coupled to output terminals RO1, RO2, RO3, and RO4.

When the width of the read column decoder is set at eight wide, i.e., $X_8$ is asserted (i.e., is set at 1) while $X_1$, $X_2$, and $X_4$ are de-asserted (i.e., are set at 0), then only eight gates are on for each address input. For example, when the address signal is xxx (i.e., $A_0$=x, $A_1$=x, and $A_2$=x, where x is either 0 or 1), then only gates 401, 403, 405, 408, 410, 413, 416, and 420 are on and the remaining gates are off.

As can be seen in Table 2, when the width of the read column decoder is set at eight wide, then for each address input, gates 401, 403, 405, 408, 410, 413, 416, and 420 are on, while the other gates are off. As can be seen in FIG. 4, gates 401, 403, 405, 408, 410, 413, 416, and 420 are coupled to terminals RI1, RI2, RI3, RI4, RI5, RI6, RI7 and RI8, respectively. As can also be seen in FIG. 4, gates 401, 403, 405, 408, 410, 413, 416, and 420 are coupled to terminals RO1, RO2, RO3, RO4, RO5, RO6, RO7, and RO8, respectively. Thus, when the width of the read column decoder 130, 230 is set at eight wide, then data signals received on the eight read column decoder data input terminals RI1, RI2, RI3, RI4, RI5, RI6, RI7, and RI8 are output by the read column decoder 130, 230 on the read column decoder data output terminals RO1, RO2, RO3, RO4, RO5, RO6, RO7, and RO8, respectively.

It is to be noted that the gate control circuit 350, 450 shown in FIG. 5 is only one embodiment of a gate control circuit that can be used in the present invention. Other gate control circuits can also be used in the present invention.

In the embodiments shown in FIGS. 3, 4, and 6, gate control circuit 350 is used to control the state of gates 301-320 (or gates 601-620) in the write column decoder while gate control circuit 450 is used to control the state of gates 401-420 in the read column decoder. In another embodiment, one gate control circuit can be used for both the write column decoder and the read column decoder. In such an embodiment, one set of address and width mode signals would be used to control the gates 301-320 (or gates 601-620) of the write column decoder while another set of address and width mode signals would be used to control the gates 401-420 of the read column decoder.

The width mode signals input to the write column decoder 110 determine the width of the input data signal path for the device 100. Similarly, the width mode signals input to the read column decoder 130 determine the width of the output data signal path for the device 100. Thus, the write column decoder 110 and the read column decoder 130 determine the width of the input data signal path and the output data signal path, respectively, of the device 100.

In one embodiment, when the width mode of the write column decoder 110 is wider than the width mode of the read column decoder 130, then the device 100 operates as a multiplexer. Similarly, in one embodiment, when the width mode of the write column decoder 110 is narrower than the width mode of the read column decoder 130, then the device 100 operates as a demultiplexer.

For example, if device 100 operates as a 4X2 multiplexer, then the write column decoder 110 would be set in by four mode, while the read column decoder 130 would be set in by two mode. Assuming that N is equal to 8, as the write column decoder 110 is set in by four mode, depending on the address signals input to the write column decoder 110, the write column decoder 110 (of the embodiment shown in FIG. 3) would select either the data signals on terminals DI1 to DI4 or terminals DI5 to DI8 for outputting on terminals WO1 to WO4. For example, if the address signal input to the write column decoder is 0xx (where x is either 0 or 1), then the data signals on terminals DI1 to DI4 would be output on terminals WO1 to WO4. As the read column decoder 130 is set in by two mode, depending on the address signals input to the read column decoder 130, the read column decoder 130 would select either the data signals on terminals RI1 to R12 or terminals RI3 to RI4 for outputting on terminals RO1 to RO2. For example, if the address signal input to the read column decoder is 01x (where x is either 0 or 1), then the data signals on terminals RI3 to RI4 would be output on terminals RO1 to RO2. It is to be noted that in the above multiplexer, the write column decoder 110 used is one such as that of the embodiment shown in FIG. 3.

For example, if device 100 operates as a 2X4 demultiplexer, then the write column decoder 110 would be set in by two mode, while the read column decoder 130 would be set in by four mode. Assuming that N is equal to 8, as the write column decoder 110 is set in by two mode, depending on the address signals input to the write column decoder 110, the write column decoder 110 (of the embodiment shown in FIG. 3) would select either the data signals on terminals DI1 to DI2, terminals DI3 to DI4, terminals DI5 to DI6, or terminals DI7 to DI8 for outputting on terminals WO1 to WO2. For example, if the address signal input to the write column decoder is 10x (where x is either 0 or 1), then the data signals on terminals DI5 to DI6 would be output on terminals WO1 to WO2. As the read column decoder 130 is set in by four mode, depending on the address signals input to the read column decoder 130, the read column decoder 130 would select either the data signals on terminals RI1 to RI4 or terminals RI5 to RI8 for outputting on terminals RO1 to RO4. As noted above, data signals received by memory array 120 on terminals WO1 to WO8 are output by memory array 120 on terminals SMO1 to SMO8, respectively, or terminals MO1 to MO8, respectively. Moreover, RI1 to RI8 receive data signals from terminals SMO1 to SMO8, respectively, or terminals MO1 to MO8, respectively. Because write column decoder 110 (of the embodiment shown in FIG. 3) is operating in the by two mode and, therefore, has active output signals on only terminals WO1 and WO2, read column decoder 130, in the by four mode, would be limited to address signal 0xx (where x is either 0 or 1) which would encompass selecting data signals on terminals RI1 to RI4 which receive data signals carried on terminals WO1 to WO4, respectively. It is to be noted that inputting the address signal 1xx (where x is either 0 or 1) to the read column decoder 130 would cause it to select data signals on terminals RI5 to RI8 which do not receive data signals carried on terminals WO1 to WO4, but those carried on terminals WO5 to WO8, respectively. In the by four mode, when the address signal input to the read column decoder is 0xx (where x is either 0 or 1), then the data signals on terminals RI1 to RI4 would be output on terminals RO1 to RO4. As only terminals WO1 and WO2 carry active signals, the data signals on only terminals RI1 and RI2, and therefore, on only terminals RO1 and RO2 are active. In one embodiment, terminals RO3 and RO4 are tristated (i.e., coupled to a high impedance), coupled to a high voltage (which in a binary logic system provides a logical high state, e.g., 1), or coupled to a low voltage (which in a binary logic system provides a logical low state, e.g., 0). It is to be noted that in the above demultiplexer, the write column decoder 110 used is one such as that of the embodiment shown in FIG. 3.

When device 200 operates as a multiplexer, data signals received from lines 222, which are coupled to terminals DI1 to DIN, are selected by selectors 225. These selected signals are provided to read column decoder 230 via terminals RI1 to RIN. The fanin of the multiplexer is equal to the number of terminals DI1 to DIN which receive data signals. The width mode signals input into read column decoder 230 determine the fanout of the multiplexer. For example, if the width mode signal input to read column decoder 230 is by two mode, then the read column decoder 230 selects signals received on two of the terminals RI1 to RIN and outputs those signals on terminals RO1 and RO2. The two terminals whose signals are selected by the read column decoder 230 are determined by the address signals received by the read column decoder 230 and the value of N. For example, if N is equal to 8 and the address signal is 11x (where x is either 0 or 1), then data signals on terminals RI7 and RI8 are selected by the read column decoder 230 and output on terminals RO1 and RO2. Thereafter, these data signals on terminals RO1 and RO2 are selected by selectors 235 and output on terminals DO1 and DO2.

When device 200 operates as a demultiplexer, data signals are provided to write column decoder 210 on some, but not all, of terminals DI1 to DIN. The fanin of the demultiplexer is determined by the number of terminals DI1 to DIN which receive data signals. The width mode signals input into write column decoder 210 corresponds to the number of terminals DI1 to DIN which receive data signals. The fanout of the demultiplexer is N. For example, if the width mode signal input to write column decoder 210 is by two mode, then the write column decoder 210 (of the embodiment shown in FIG. 3) selects signals received on two of the terminals DI1 to DIN and outputs those signals on terminals WO1 and WO2. The two terminals whose signals are selected by the write column decoder 210 are determined by the address signals received by the write column decoder 210 and the value of N. The address signals would depend on which terminals of terminals DI1 to DI8 receive data signals. For example, if data signals are input on terminals DI5 and DI6, then the address signal would be 10x (where x is either 0 or 1) which, in the by two mode, prompts for selecting data signals on terminals DI5 and DI6. When N is equal to 8 and the address signal is 10x (where x is either 0 or 1), then data signals on terminals DI5 and DI6 are selected by the write column decoder 210 (of the embodiment shown in FIG. 3) and output on terminals WO1 and WO2. The remaining terminals WO3 to WO8 are either tristated, coupled to a high voltage, or coupled to a low voltage. In the above example, the device 200 effectively operates as a 2X8 demultiplexer. In this embodiment, demultiplexing involves having a fanout that is larger than the fanin. As explained above, when the device 200 operates as a demultiplexer, data signals output on terminals WO1 to WON are sent to selectors 235 via lines 224. Thereafter selectors 235 select these signals and output them on terminals DO1 to DON. It is to be noted that in the above demultiplexer, the write column decoder 210 used is one such as that of the embodiment shown in FIG. 3.

FIG. 6 is a detailed diagram of a second embodiment of the write column decoder 110, 210 used in the present invention. In FIG. 6, the write column decoder 110, 210 includes eight write column decoder data input terminals DI1 to DI8 and eight write column decoder data output terminals WO1 to WO8. In other words, the integer N in FIGS. 1 and 2, and described above, is equal to 8. It is to be noted that the write column decoder 110, 210 is not limited to the 8 input, 8 output embodiment. Instead, it can have any number of N inputs and outputs as defined above.

In FIG. 6, write column decoder 110, 210 includes signal routing circuit 640, gate control circuit 350, write column data input terminals DI1 to DI5, and write column data output terminals WO1 to WO8. Input data signals are received by the signal routing circuit 640 via the write column data input terminals DI1 to DI8. Data signals are also output by the signal routing circuit 640 via the write column data output terminals WO1 to WO8. Address signals are received on address data terminals 112, 212 coupled to the gate control circuit 350. Similarly, width mode signals are received on the width mode terminals 114, 214 coupled to the gate control circuit 350.

The signal routing circuit 640 includes gates 601-620. In one embodiment, gates 601-620 comprise switches. The switches may comprise transistors. The transistors may, for example, be NMOS transistors or PMOS transistors.

Signal routing circuit 640 is coupled to the gate control circuit 350 via lines 645. More specifically, gates 601-620 are coupled to gate control circuit 350. The control signals output by the gate control circuit 350 are determined by the state of the address signals and width mode signals received on the address terminals 112, 212 and width mode terminals 114, 214, respectively. Control signals from gate control circuit 350 control the state of gates 601-620. When a control signal causes a gate to be on, then the write column decoder data input and output terminals between which the gate is disposed are electrically coupled. Otherwise, they are electrically isolated. For example, when gate 602 is on, then write column decoder data input terminal DI1 is electrically coupled to write column decoder data output terminal WO2. In such a case, a data input signal received on terminal DI1 is passed on to terminal WO2.

Table 3 below shows the relationship between the width mode signals, the address signals, and the gates in the signal routing circuit 640 which are turned on.

TABLE 3

| Width Mode Signal | | | | A[2:0] | | | Gates in the signal routing circuit |
|---|---|---|---|---|---|---|---|
| $X_1$ | $X_2$ | $X_4$ | $X_8$ | $A_2$ | $A_1$ | $A_0$ | 640 which are turned on |
| 1 | 0 | 0 | 0 | 0 | 0 | 0 | 601 |
|   |   |   |   | 0 | 0 | 1 | 602 |
|   |   |   |   | 0 | 1 | 0 | 604 |
|   |   |   |   | 0 | 1 | 1 | 606 |
|   |   |   |   | 1 | 0 | 0 | 609 |
|   |   |   |   | 1 | 0 | 1 | 611 |
|   |   |   |   | 1 | 1 | 0 | 614 |
|   |   |   |   | 1 | 1 | 1 | 617 |
| 0 | 1 | 0 | 0 | 0 | 0 | x | 601, 603 |
|   |   |   |   | 0 | 1 | x | 604, 607 |
|   |   |   |   | 1 | 0 | x | 609, 612 |
|   |   |   |   | 1 | 1 | x | 614, 618 |
| 0 | 0 | 1 | 0 | 0 | x | x | 601, 603, 605, 608 |
|   |   |   |   | 1 | x | x | 609, 612, 615, 619 |
| 0 | 0 | 0 | 1 | x | x | x | 601, 603, 605, 608, 610, 613, 616, 620 |

As can be seen in Table 3, when the width of the write column decoder is set at one wide, i.e., $X_1$ is asserted (i.e., is set at 1) while $X_2$, $X_4$, and $X_8$ are de-asserted (i.e., are set at 0), then only one gate is on for each address signal. For example, when the address signal is 010 (i.e., $A_0$=0, $A_1$=1, and $A_2$=0), then only gate 604 is on and the remaining gates are off.

As can be seen in Table 3, when the width of the write column decoder is set at one wide, then for each address input, one of gates 601, 602, 604, 606, 609, 611, 614, and 617 is on, while the other gates are off. As can be seen in FIG. 6, gates 601, 602, 604, 606, 609, 611, 614, and 617 are coupled to output terminals WO1, WO2, WO3, WO4, WO5, WO6, WO7, and WO8, respectively. Moreover, gates 601, 602, 604, 606, 609, 611, 614, and 617 are all coupled to only input terminal DI1. Thus, when the width of the write column decoder 110, 210 is set at one wide, then a data signal received on the write column decoder data input terminal DI1 is output by the write column decoder 110, 210 on one of the write column decoder data output terminals WO1 to WO8.

When the width of the write column decoder is set at two wide, i.e., $X_2$ is asserted (i.e., is set at 1) while $X_1$, $X_4$, and $X_8$ are de-asserted (i.e., are set at 0), then only two gates are on for each address input. For example, when the address signal is 01x (i.e., $A_0$=x, $A_1$=1, and $A_2$=0, where x is either 0 or 1), then only gates 604 and 607 are on and the remaining gates are off.

As can be seen in Table 3, when the width of the write column decoder is set at two wide, then for each address input, two of gates 601, 603, 604, 607, 609, 612, 614, and 618 are on, while the other gates are off. More specifically, gates 601 and 603, gates 604 and 607, gates 609 and 612, or gates 614 and 618 are on, while the other gates are off. As can be seen in FIG. 6, gates 601 and 603, gates 604 and 607, gates 609 and 612, and gates 614 and 618 are coupled to terminals WO1 and WO2, terminals WO3 and WO4, terminals WO5 and WO6, and terminals WO7 and WO8, respectively. As can also be seen in FIG. 6, gates 601 and 603, gates 604 and 607, gates 609 and 612, and gates 614 and 618 are coupled to input terminals DI1 and DI2 only. Thus, when the width of the write column decoder 110, 210 is set at two wide, then data signals received on the write column decoder data input terminals DI1 to DI2 are output by the write column decoder 110, 210 on two of the write column decoder data output terminals WO1 to WO8. More specifically, data signals received on input terminals DI1 and DI2 are coupled to terminals WO1 and WO2, terminals WO3 and WO4, terminals WO5 and WO6, or terminals WO7 and WO8.

When the width of the write column decoder is set at four wide, i.e., $X_4$ is asserted (i.e., is set at 1) while $X_1$, $X_2$, and $X_8$ are de-asserted (i.e., are set at 0), then only four gates are on for each address input. For example, when the address signal is 0xx (i.e., $A_0$=x, $A_1$=x, and $A_2$=0, where x is either 0 or 1), then only gates 601, 603, 605, and 608 are on and the remaining gates are off.

As can be seen in Table 3, when the width of the write column decoder is set at four wide, then for each address input, four of gates 601, 603, 605, 608, 609, 612, 615, and 619 are on, while the other gates are off. More specifically, gates 601, 603, 605 and 608, or gates 609, 612, 615 and 619 are on, while the other gates are off. As can be seen in FIG. 6, gates 601, 603, 605 and 608, and gates 609, 612, 615 and 619 are coupled to terminals WO1, WO2, WO3 and WO4, and terminals WO5, WO6, WO7 and WO8, respectively. As can also be seen in FIG. 6, gates 601, 603, 605 and 608, and gates 609, 612, 615 and 619 are coupled to input terminals DI1, DI2, DI3, and DI4 only. Thus, when the width of the write column decoder 110, 210 is set at four wide, then data signals received on the write column decoder data input terminals DI1 to DI4 are output by the write column decoder 110, 210 on four of the write column decoder data output terminals WO1 to WO8. More specifically, data signals received on input terminals DI1, DI2, DI3 and DI4, are coupled to output terminals WO1, WO2, WO3, and WO4 or output terminals WO5, WO6, WO7 and WO8.

When the width of the write column decoder is set at eight wide, i.e., $X_8$ is asserted (i.e., is set at 1) while $X_1$, $X_2$, and $X_4$ are de-asserted (i.e., are set at 0), then only eight gates are on for each address input. For example, when the address signal is xxx (i.e., $A_0$=x, $A_1$=x, and $A_2$=x, where x is either 0 or 1), then only gates 601, 603, 605, 608, 610, 613, 616, and 620 are on and the remaining gates are off.

As can be seen in Table 3, when the width of the write column decoder is set at eight wide, then for each address input, gates 601, 603, 605, 608, 610, 613, 616, and 620 are on, while the other gates are off. As can be seen in FIG. 6, gates 601, 603, 605, 608, 610, 613, 616, and 620 are coupled to terminals WO1, WO2, WO3, WO4, WO5, WO6, WO7, and WO8, respectively. As can also be seen in FIG. 6, gates 601, 603, 605, 608, 610, 613, 616, and 620 are coupled to terminals DI1, DI2, DI3, DI4, DI5, DI6, DI7 and DI8, respectively. Thus, when the width of the write column decoder 110, 210 is set at eight wide, then data signals received on the eight write column decoder data input terminals DI1, DI2, DI3, DI4, DI5, DI6, DI7, and DI8 are output by the write column decoder 110, 210 on the write column decoder data output terminals WO1, WO2, WO3, WO4, WO5, WO6, WO7, and WO8, respectively.

As noted above, the width mode signals input to the write column decoder 110 determine the width of the input data signal path for the device 100. Similarly, the width mode signals input to the read column decoder 130 determine the width of the output data signal path for the device 100. Thus, the write column decoder 110 and the read column decoder 130 determine the width of the input data signal path and the output data signal path, respectively, of the device 100.

As also noted above, in one embodiment, when the width mode of the write column decoder 110 is wider than the width mode of the read column decoder 130, then the device 100 operates as a multiplexer. Similarly, as noted above, in one embodiment, when the width mode of the write column decoder 110 is narrower than the width mode of the read column decoder 130, then the device 100 operates as a demultiplexer.

For example, if device 100 operates as a 4X2 multiplexer, then the write column decoder 110 would be set in by four mode, while the read column decoder 130 would be set in by two mode. Assuming that N is equal to 8, as the write column decoder 110 is set in by four mode, depending on the address signals input to the write column decoder 110, the write column decoder 110 (of the embodiment shown in FIG. 6) would output on either output terminals WO1 to WO4 or output terminals WO5 to WO8 data signals received on input terminals DI1 to DI4. For example, if the address signal input to the write column decoder is 0xx (where x is either 0 or 1), then the data signals on the input terminals DI1 to DI4 would be output on output terminals WO1 to WO4. As the read column decoder 130 is set in by two mode, depending on the address signals input to the read column decoder 130, the read column decoder 130 would select either the data signals on terminals RI1 to RI2 or terminals RI3 to RI4 for outputting on terminals RO1 to RO2. For example, if the address signal input to the read column decoder is 01x (where x is either 0 or 1), then the data signals on terminals RI3 to RI4 would be output on terminals RO1 to RO2. It is to be noted that in the above multiplexer, the write column decoder 110 used is one such as that of the embodiment shown in FIG. 6.

For example, if device 100 operates as a 2X4 demultiplexer, then the write column decoder 110 would be set in by two mode, while the read column decoder 130 would be set in by four mode. Assuming that N is equal to 8, as the write column decoder 110 is set in by two mode, depending on the address signals input to the write column decoder 110, the write column decoder 110 (of the embodiment shown in FIG. 6) would output on either output terminals WO1 to WO2, output terminals WO3 to WO4, output terminals WO5 to WO6, or output terminals WO7 to WO8 data signals received on input terminals DI1 to DI2. For example, if the address signal input to the write column decoder is 10x (where x is either 0 or 1), then the data signals on input terminals DI1 to DI2 would be output on output terminals WO5 to WO6. As the read column decoder 130 is set in by four mode, depending on the address signals input to the read column decoder 130, the read column decoder 130 would select either the data signals on terminals RI1 to RI4 or terminals RI5 to RI8 for outputting on terminals RO1 to RO4. As noted above, data signals received by memory array 120 on terminals WO1 to WO8 are output by memory array 120 on terminals SMO1 to SMO8, respectively, or terminals MO1 to MO8, respectively. Moreover, RI1 to RI8 receive data signals from terminals SMO1 to SMO8, respectively, or terminals MO1 to MO8, respectively. Because write column decoder 110 (of the embodiment shown in FIG. 6) is operating in the by two mode and has an address signal input of 10x and, therefore, has active output signals on only terminals WO5 and WO6, read column decoder 130, in the by four mode, would be limited to address signal 1xx (where x is either 0 or 1) which would encompass selecting data signals on terminals RI5 to RI8 which receive data signals carried on terminals WO5 to WO8, respectively. It is to be noted that inputting the address signal 0xx (where x is either 0 or 1) to the read column decoder 130 would cause it to select data signals on terminals RI1 to RI4 which do not receive data signals carried on terminals WO5 to WO8, but those carried on terminals WO1 to WO4, respectively. In the by four mode, when the address signal input to the read column decoder is 1xx (where x is either 0 or 1), then the data signals on terminals RI5 to RI8 would be output on terminals RO5 to RO8. As only terminals WO5 and WO6 carry active signals, the data signals on only terminals RI5 and RI6, and therefore, on only terminals RO5 and RO6 are active. In one embodiment, terminals RO7 and RO8 are tristated (i.e., coupled to a high impedance), coupled to a high voltage (which in a binary logic system provides a logical high state, e.g., 1), or coupled to a low voltage (which in a binary logic system provides a logical low state, e.g., 0). It is to be noted that in the above demultiplexer, the write column decoder 110 used is one such as that of the embodiment shown in FIG. 6.

When device 200 operates as a multiplexer, data signals received from lines 222, which are coupled to terminals DI1 to DIN, are selected by selectors 225. These selected signals are provided to read column decoder 230 via terminals RI1 to RIN. The fanin of the multiplexer is equal to the number of terminals DI1 to DIN which receive data signals. The width mode signals input into read column decoder 230 determine the fanout of the multiplexer. For example, if the width mode signal input to read column decoder 230 is by two mode, then the read column decoder 230 selects signals received on two of the terminals RI1 to RIN and outputs those signals on terminals RO1 and RO2. The two terminals whose signals are selected by the read column decoder 230 are determined by the address signals received by the read column decoder 230 and the value of N. For example, if N is equal to 8 and the address signal is 11x (where x is either 0 or 1), then data signals on terminals RI7 and RI8 are selected by the read column decoder 230 and output on terminals RO1 and RO2. Thereafter, these data signals on terminals RO1 and RO2 are selected by selectors 235 and output on terminals DO1 and DO2.

When device 200 operates as a demultiplexer, data signals are provided to write column decoder 210 (of the embodiment shown in FIG. 6) on some, but not all, of terminals DI1 to DIN. The fanin of the demultiplexer is determined by the number of terminals DI1 to DIN which receive data signals. The width mode signals input into write column decoder 210 corresponds to the number of terminals DI1 to DIN which receive data signals. The fanout of the demultiplexer is N. For example, if the width mode signal input to write column decoder 210 is by two mode, then the write column decoder 210 (of the embodiment shown in FIG. 6) selects signals received on input terminals DI1 and DI2 and outputs those signals on two of the output terminals WO1 to WON. The two output terminals that are selected by the write column decoder 210 for receiving signals from the input terminals DO1 and DO2 are determined by the address signals received by the write column decoder 210 and the value of N. For example, when N is equal to 8 and the address signal is 10x (where x is either 0 or 1), then data signals on input terminals DI1 and DI2 are output by the write column decoder 210 (of the embodiment shown in FIG. 6) on terminals WO5 and WO6. In one embodiment, the remaining terminals WO1 to WO4 and WO7 to WO8 are either tristated, coupled to a high voltage, or coupled to a low voltage. In the above example, the device 200 effectively operates as a 2X8 demultiplexer. As explained above, when the device 200 operates as a demultiplexer, data signals output on terminals WO1 to WON are sent to selectors 235 via lines 224. Thereafter selectors 235 select these signals and output them on terminals DO1 to DON. It is to be noted that in the above demultiplexer, the write column decoder 210 used is one such as that of the embodiment shown in FIG. 6.

It is to be noted that in device 100, when the write column decoder 110 is one such as that of the embodiment shown in FIG. 6, then the width mode of the write column decoder 110 need not be narrower than the width mode of the read column decoder 130 in order for the device 100 to operate as a demultiplexer. Similarly, when the write column decoder 210 is one such as that of the embodiment shown in FIG. 6, then the fanout of the write column decoder 210 (and, therefore, the fanout of device 200) need not be greater than the fanin of the write column decoder 210 (and, therefore, the fanin of device 200) in order for the device 200 to operate as a demultiplexer. In one embodiment, demultiplexing involves receiving a signal or signals on a predetermined input terminal or terminals and selecting an output terminal or terminals on which to output the input signal or signals. Thus, receiving a signal on input terminal DI1 and selecting an output terminal on which to output the signal, e.g., one of output terminals WO1 to WO8, is an example of demultiplexing. Similarly, in one embodiment, multiplexing involves selecting one of a plurality of input terminals on which to receive an input signal and outputting the input signal on a predetermined output terminal. Thus, selecting an input terminal on which to receive an input signal, e.g., one of the input terminals RI to RI8, and outputting the signal on output terminal RO1, is an example of multiplexing.

The device of the present invention may be used in many systems. For example, the device may be used in a digital system. More specifically, the device may be used in a digital system comprising a programmable logic device (PLD), which as used herein also refers to complex PLD's (CPLD's). Additionally, the device may be used in a PLD. In one embodiment, the device is on the same die/chip as the PLD. In one embodiment, an embedded array block (EAB) in a PLD may comprise the device. In one embodiment, an embedded system block (ESB) in a PLD may comprise the device. As used herein a digital system is not intended to be limited to a purely digital system, but also encompasses hybrid systems that include both digital and analog subsystems. Thus, the present invention encompasses digital systems that include the device described herein.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

The invention claimed is:

1. A device programmable to operate as one of a memory device, a multiplexer, and a demultiplexer, comprising:
   a first column decoder;
   a memory array coupled to the first column decoder;
   a plurality of selectors coupled to the memory array; and
   a second column decoder coupled to the plurality of selectors,
   wherein the first column decoder comprises a first plurality of width mode input terminals to receive a first width mode signal, wherein when the device operates as a multiplexer, the first width mode signal determines a multiplexer fanin.

2. The device of claim 1, wherein the second column decoder comprises a second plurality of width mode input terminals to receive a second width mode signal, wherein when the device operates as a multiplexer, the second width mode signal determines a multiplexer fanout, further wherein when the device operates as a demultiplexer, the first width mode signal determines a demultiplexer fanin and the second width mode signal determines a demultiplexer fanout.

3. The device of claim 1, wherein the first column decoder comprises a first plurality of data input terminals and a first plurality of data output terminals, further wherein the second column decoder comprises a second plurality of data input terminals and a second plurality of data output terminals.

4. The device of claim 3, wherein when the device operates as a multiplexer, the first plurality of data input terminals receive a plurality of data input signals and the second plurality of data output terminals output at least one data output signal.

5. The device of claim 3, wherein when the device operates as a demultiplexer, the first plurality of data input terminals receive at least one data input signal and the second plurality of data output terminals output a plurality of data output signals.

6. The device of claim 3, wherein when the device operates as a multiplexer, at least one data input terminal of the second plurality of data input terminals is selected on which to receive at least one signal, and outputting the at least one signal on at least one predetermined data output terminal of the second plurality of data output terminals.

7. The device of claim 3, wherein when the device operates as a demultiplexer, at least one signal is received on at least one predetermined data input terminal of the first plurality of data input terminals, and at least one data output terminal of the first plurality of data output terminals is selected on which to output the at least one signal.

8. The device of claim 1, wherein the memory array comprises a first plurality of memory array output terminals and a second plurality of memory array output terminals, further wherein each selector of the plurality of selectors comprises a two-by-one selector including first and second selector input terminals and a first selector output terminal, wherein for each selector of the plurality of selectors, the first selector input terminal is coupled to a first corresponding memory array output terminal of the first plurality of memory array output terminals and the second selector input terminal is coupled to a second corresponding memory array output terminal of the second plurality of memory array output terminals.

9. The device of claim 8, wherein the first plurality of memory array output terminals receive data signals output by the first column decoder, but not stored in the memory array, further wherein the second plurality of memory array output terminals receive data signals output by the first column decoder and stored in the memory array, wherein when the device operates as one of a multiplexer and a demultiplexer, then each selector of the plurality of selectors selects a first input signal received on the first selector input terminal and outputs the first input signal on the first selector output terminal, further wherein when the device operates as a memory device, then each selector of the plurality of selectors selects a second input signal received on the second selector input terminal and outputs the second input signal on the first selector output terminal.

10. The device of claim 1, wherein the first column decoder comprises a write column decoder, the second column decoder comprises a read column decoder, and the memory array comprises a static random access memory (SRAM) array.

11. The device of claim 3, further comprising:
    a first plurality of lines coupled to the first plurality of data input terminals and the plurality of selectors;
    a second plurality of selectors coupled to the second column decoder; and a second plurality of lines coupled to the first plurality of data output terminals and the second plurality of selectors.

12. The device of claim 11, wherein each selector of the plurality of selectors comprises a two-by-one selector including first and second selector input terminals and a first selector output terminal, further wherein each selector of the second plurality of selectors comprises a two-by-one selector including third and fourth selector input terminals and a second selector output terminal.

13. The device of claim 12, wherein each line of the first plurality of lines is coupled to one corresponding data input terminal of the first plurality of data input terminals and one corresponding selector of the plurality of selectors, further wherein each line of the second plurality of lines is coupled to one corresponding data output terminal of the first plurality of data output terminals and one corresponding selector of the second plurality of selectors.

14. The device of claim 13, wherein the memory array comprises a first plurality of memory array output terminals.

15. The device of claim 14, wherein for each selector of the plurality of selectors, the first selector input terminal is coupled to a corresponding line of the first plurality of lines, the second selector input terminal is coupled to a corresponding memory array output terminal of the first plurality of memory array output terminals, and the first selector output terminal is coupled to a corresponding data input terminal of the second plurality of data input terminals, wherein for each selector of the second plurality of selectors, the third selector input terminal is coupled to a corresponding line of the second plurality of lines, the fourth selector input terminal is coupled to a corresponding data output terminal of the second plurality of data output terminals, and the second selector output terminal is coupled to a corresponding device data output terminal of a plurality of device data output terminals.

16. The device of claim 15, wherein when the device operates as a multiplexer, each selector of the plurality of selectors selects a first input signal received on the first selector input terminal and outputs the first input signal on the first selector output terminal, further wherein each selector of the second plurality of selectors selects a data signal that it receives on the fourth selector input terminal and outputs the data signal on the second selector output terminal.

17. The device of claim 15, wherein when the device operates as a demultiplexer, each selector of the second plurality of selectors selects a data signal that it receives on the third selector input terminal and outputs the data signal on the second selector output terminal.

18. The device of claim 15, wherein when the device operates as a memory device, each selector of the plurality of selectors selects a second input signal received on the second selector input terminal and outputs the second input signal on the first selector output terminal, further wherein each selector of the second plurality of selectors selects a data signal that it receives on the fourth selector input terminal and outputs the data signal on the second selector output terminal, wherein the data signal is the second input signal.

19. The device of claim 3, wherein the first column decoder comprises a first signal routing circuit and a first gate control circuit coupled to the first signal routing circuit, further wherein the second column decoder comprises a second signal routing circuit and a second gate control circuit coupled to the second signal routing circuit.

20. The device of claim 19, wherein the first signal routing circuit comprises a first plurality of gates, wherein each gate of the first plurality of gates is coupled to a corresponding data input terminal of the first plurality of data input terminals and a corresponding data output terminal of the first plurality of data output terminals, further wherein the second signal routing circuit comprises a second plurality of gates, wherein each gate of the second plurality of gates is coupled to a corresponding data input terminal of the second plurality of data input terminals and a corresponding data output terminal of the second plurality of data output terminals.

21. The device of claim 20, wherein the first gate control circuit receives first address signals and first width mode signals on first address terminals and first width mode terminals, respectively, further wherein the first gate control circuit uses the first address signals and first width mode signals to determine first control signals that are sent to the first plurality of gates, wherein the first control signals determine states for each gate of the first plurality of gates, wherein the second gate control circuit receives second address signals and second width mode signals on second address terminals and second width mode terminals, respectively, further wherein the second gate control circuit uses the second address signals and second width mode signals to determine second control signals that are sent to the second plurality of gates, wherein the second control signals determine states for each gate of the second plurality of gates.

22. An embedded array block (EAB) in a programmable logic device (PLD) comprising the device of claim 1.

23. An embedded system block (ESB) in a programmable logic device (PLD) comprising the device of claim 1.

24. A device programmable to operate as one of a memory device, a multiplexer, and a demultiplexer, comprising:
a write column decoder (WCD) comprising:
   a plurality of WCD data input terminals;
   a plurality of WCD data output terminals;
   a WCD signal routing circuit coupled to the plurality of WCD data input terminals and the plurality of WCD data output terminals; and
   a WCD gate control circuit coupled to the WCD signal routing circuit;
a memory array coupled to the WCD by the plurality of WCD data output terminals, the memory array comprising a first plurality of memory array data output terminals for outputting data signals received from the WCD and stored in the memory array and a second plurality of memory array data output terminals for outputting data signals received from the WCD, but not stored in the memory array;
a first plurality of selectors coupled to the memory array, the first plurality of selectors comprising a plurality of selector output terminals, each selector including a first selector input terminal, a second selector input terminal, and a selector output terminal, wherein the first selector input terminal is coupled to a corresponding terminal of the first plurality of memory array data output terminals and the second selector input terminal is coupled to a corresponding terminal of the second plurality of memory array data output terminals; and
a read column decoder (RCD) comprising:
   a plurality of RCD data input terminals, wherein each RCD data input terminal of the plurality of RCD data input terminals is coupled to a corresponding selector output terminal of the plurality of selector output terminals;
   a plurality of RCD data output terminals;
   an RCD signal routing circuit coupled to the plurality of RCD data input terminals and the plurality of RCD data output terminals; and
   an RCD gate control circuit coupled to the RCD signal routing circuit.

25. The device of claim 24, wherein the WCD signal routing circuit comprises a first plurality of gates, wherein each gate of the first plurality of gates is coupled to a corresponding data input terminal of the plurality of WCD data input terminals and a corresponding data output terminal of the plurality of WCD data output terminals, further wherein the RCD signal routing circuit comprises a second plurality of gates, wherein each gate of the second plurality of gates is coupled to a corresponding data input terminal of the plurality of RCD data input terminals and a corresponding data output terminal of the plurality of RCD data output terminals.

26. The device of claim 25, wherein the WCD gate control circuit receives first address signals and first width mode signals on first address terminals and first width mode terminals, respectively, further wherein the WCD gate control circuit uses the first address signals and first width mode signals to determine first control signals that are sent to the first plurality of gates, wherein the first control signals determine states for each gate of the first plurality of gates, wherein the RCD gate control circuit receives second address signals and second width mode signals on second address terminals and second width mode terminals, respectively, further wherein the RCD gate control circuit uses the second address signals and second width mode signals to determine second control signals that are sent to the second plurality of gates, wherein the second control signals determine states for each gate of the second plurality of gates.

27. The device of claim 26, wherein when the device operates as one of a multiplexer and a demultiplexer, then each selector of the first plurality of selectors selects a second input signal received on the second selector input terminal and outputs the second input signal on the selector output terminal, further wherein when the device operates as a memory device, then each selector of the first plurality of selectors selects a first input signal received on the first selector input terminal and outputs the first input signal on the selector output terminal.

28. An embedded array block (EAB) in a programmable logic device (PLD) comprising the device of claim 24.

29. An embedded system block (ESB) in a programmable logic device (PLD) comprising the device of claim 24.

30. A device programmable to operate as one of a memory device, a multiplexer, and a demultiplexer, comprising:
a write column decoder (WCD) comprising:
a plurality of WCD data input terminals;
a plurality of WCD data output terminals;
a WCD signal routing circuit coupled to the plurality of WCD data input terminals and the plurality of WCD data output terminals; and
a WCD gate control circuit coupled to the WCD signal routing circuit;
a first plurality of lines coupled to the plurality of WCD data input terminals, wherein each line of the first plurality of lines is coupled to a corresponding terminal of the plurality of WCD data input terminals;
a second plurality of lines coupled to the plurality of WCD data output terminals, wherein each line of the second plurality of lines is coupled to a corresponding terminal of the plurality of WCD data output terminals;
a memory array coupled to the WCD by the plurality of WCD data output terminals, the memory array comprising a first plurality of memory array data output terminals;
a first plurality of selectors coupled to the memory array, the first plurality of selectors comprising a first plurality of selector output terminals, each selector including a first selector input terminal, a second selector input terminal, and a first selector output terminal, wherein the first selector input terminal is coupled to a corresponding terminal of the first plurality of memory array data output terminals and the second selector input terminal is coupled to a corresponding line of the first plurality of lines;
a read column decoder (RCD) comprising:
a plurality of RCD data input terminals, wherein each RCD data input terminal of the plurality of RCD data input terminals is coupled to a corresponding first selector output terminal of the first plurality of selector output terminals;
a plurality of RCD data output terminals;
an RCD signal routing circuit coupled to the plurality of RCD data input terminals and the plurality of RCD data output terminals; and
an RCD gate control circuit coupled to the RCD signal routing circuit; and
a second plurality of selectors coupled to the RCD, the second plurality of selectors comprising a second plurality of selector output terminals, each selector including a third selector input terminal, a fourth selector input terminal, and a second selector output terminal, wherein the third selector input terminal is coupled to a corresponding terminal of the plurality of RCD data output terminals and the fourth selector input terminal is coupled to a corresponding line of the second plurality of lines.

31. The device of claim 30, wherein the WCD signal routing circuit comprises a first plurality of gates, wherein each gate of the first plurality of gates is coupled to a corresponding data input terminal of the plurality of WCD data input terminals and a corresponding data output terminal of the plurality of WCD data output terminals, further wherein the RCD signal routing circuit comprises a second plurality of gates, wherein each gate of the second plurality of gates is coupled to a corresponding data input terminal of the plurality of RCD data input terminals and a corresponding data output terminal of the plurality of RCD data output terminals.

32. The device of claim 31, wherein the WCD gate control circuit receives first address signals and first width mode signals on first address terminals and first width mode terminals, respectively, further wherein the WCD gate control circuit uses the first address signals and first width mode signals to determine first control signals that are sent to the first plurality of gates, wherein the first control signals determine states for each gate of the first plurality of gates, wherein the RCD gate control circuit receives second address signals and second width mode signals on second address terminals and second width mode terminals, respectively, further wherein the RCD gate control circuit uses the second address signals and second width mode signals to determine second control signals that are sent to the second plurality of gates, wherein the second control signals determine states for each gate of the second plurality of gates.

33. The device of claim 32, wherein when the device operates as a multiplexer, then each selector of the first plurality of selectors selects a second input signal received on the second selector input terminal and outputs the second input signal on the first selector output terminal, further wherein when the device operates as a memory device, then each selector of the first plurality of selectors selects a first input signal received on the first selector input terminal and outputs the first input signal on the first selector output terminal.

34. The device of claim 32, wherein when the device operates as a demultiplexer, then each selector of the second plurality of selectors selects a fourth input signal received on the fourth selector input terminal and outputs the fourth input signal on the second selector output terminal.

35. An embedded array block (EAB) in a programmable logic device (PLD) comprising the device of claim 30.

36. An embedded system block (ESB) in a programmable logic device (PLD) comprising the device of claim 30.

37. An integrated circuit device comprising:
a write column decoder (WCD);
a memory array coupled to the WCD, the memory array comprising a first plurality of memory array data output terminals for outputting data signals received from the WCD and stored in the memory array and a second plurality of memory array data output terminals for outputting data signals received from the WCD, but not stored in the memory array; and
a first plurality of selectors coupled to the memory array, the first plurality of selectors comprising a plurality of selector output terminals, each selector including a first selector input terminal, a second selector input terminal, and a selector output terminal, wherein the first selector input terminal is coupled to a corresponding terminal of the first plurality of memory array data output terminals and the second selector input terminal is coupled to a corresponding terminal of the second plurality of memory array data output terminals.

38. The integrated circuit device of claim 37 further comprising:
a read column decoder (RCD) comprising a plurality of RCD data input terminals, wherein each RCD data input terminal of the plurality of RCD data input terminals is coupled to a corresponding selector output terminal of the plurality of selector output terminals.

39. The integrated circuit device of claim 38, wherein when the integrated circuit device operates as one of a multiplexer and a demultiplexer, then each selector of the first plurality of selectors selects a second input signal received on the second selector input terminal and outputs the second input signal on the selector output terminal, further wherein when the device operates as a memory device, then each selector of the first plurality of selectors selects a first input signal received on the first selector input terminal and outputs the first input signal on the selector output terminal.

40. An integrated circuit device comprising:
a write column decoder (WCD);
a first plurality of lines coupled to a plurality of WCD data input terminals, wherein each line of the first plurality of lines is coupled to a corresponding terminal of the plurality of WCD data input terminals;
a second plurality of lines coupled to a plurality of WCD data output terminals, wherein each line of the second plurality of lines is coupled to a corresponding terminal of the plurality of WCD data output terminals;
a memory array coupled to the WCD, the memory array comprising a first plurality of memory array data output terminals; and
a first plurality of selectors coupled to the memory array, the first plurality of selectors comprising a first plurality of selector output terminals, each selector including a first selector input terminal, a second selector input terminal, and a first selector output terminal, wherein the first selector input terminal is coupled to a corresponding terminal of the first plurality of memory array data output terminals and the second selector input terminal is coupled to a corresponding line of the first plurality of lines.

41. The integrated circuit device of claim 40 further comprising:
a read column decoder (RCD) comprising a plurality of RCD data input terminals, wherein each RCD data input terminal of the plurality of RCD data input terminals is coupled to a corresponding first selector output terminal of the first plurality of selector output terminals.

42. The integrated circuit device of claim 41 further comprising:
a second plurality of selectors coupled to the RCD, the second plurality of selectors comprising a second plurality of selector output terminals, each selector including a third selector input terminal, a fourth selector input terminal, and a second selector output terminal, wherein the third selector input terminal is coupled to a corresponding terminal of a plurality of RCD data output terminals and the fourth selector input terminal is coupled to a corresponding line of the second plurality of lines.

43. The device of claim 42, wherein when the integrated circuit device operates as a multiplexer, then each selector of the first plurality of selectors selects a second input signal received on the second selector input terminal and outputs the second input signal on the first selector output terminal, further wherein when the device operates as a memory device, then each selector of the first plurality of selectors selects a first input signal received on the first selector input terminal and outputs the first input signal on the first selector output terminal.

44. An integrated circuit comprising:
a memory array;
a first column decoder to, in a first mode, receive a first number of input signals at a second number of inputs of the first column decoder and provide a first number of output signals at a first number of outputs of the first column decoder, the first number of outputs of the first column decoder selected from a second number of outputs of the first column decoder, and, in a second mode, receive a second number of input signals and provide the second number of input signals to the memory array;
a second number of selectors, each selector to in the first mode, select one of the second number of outputs of the column decoder, and, in the second mode, select one of a second number of outputs from the memory array; and
a second column decoder to, in the first mode, receive a first number of input signals from a first number of the second number of selectors and provide a third number of output signals on a third number of outputs of the second column decoder, the third number of outputs of the second column decoder selected from a second number of outputs of the second column decoder, and, in the second mode, receive a second number of output signals from the selectors.

45. The integrated circuit of claim 44 wherein first number of outputs of the first column decoder are selected from the second number of outputs of the first column decoder using width and address signals.

46. The integrated circuit of claim 44 wherein the first column decoder is a write column decoder and the second column decoder is a read column decoder.

* * * * *